US007463704B1

(12) United States Patent
Tehrani et al.

(10) Patent No.: US 7,463,704 B1
(45) Date of Patent: Dec. 9, 2008

(54) MULTI-CHAIN SIGNAL DETECTION AND GAIN CONTROL FOR AUTOMATIC GAIN CONTROL SYSTEMS

(75) Inventors: Ardavan Maleki Tehrani, Menlo Park, CA (US); Xiaoru Zhang, Sunnyvale, CA (US); Paul J. Husted, San Jose, CA (US); Jeffrey M. Gilbert, Sunnyvale, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 764 days.

(21) Appl. No.: 10/884,787

(22) Filed: Jul. 1, 2004

(51) Int. Cl.
*H04L 27/08* (2006.01)

(52) U.S. Cl. .................. 375/345; 375/267; 375/347; 375/349; 455/140; 455/234.2; 455/241.1

(58) Field of Classification Search .............. 375/345, 375/147, 148, 267, 316, 340, 347, 349; 455/136, 455/140, 232.1, 234.1, 234.2, 239.1, 240.1, 455/241.1
See application file for complete search history.

(56) References Cited

U.S. PATENT DOCUMENTS

| 5,513,222 | A  | * | 4/1996  | Iwasaki          | 375/347   |
|-----------|----|---|---------|------------------|-----------|
| 6,970,523 | B2 | * | 11/2005 | Strolle et al.   | 375/345   |
| 7,024,169 | B2 | * | 4/2006  | Ciccarelli et al.| 455/232.1 |
| 7,065,164 | B1 | * | 6/2006  | Sakima           | 375/345   |
| 7,171,185 | B2 | * | 1/2007  | Matsumoto et al. | 455/324   |
| 7,215,722 | B2 | * | 5/2007  | Hsiao            | 375/319   |
| 7,271,852 | B2 | * | 9/2007  | Paik et al.      | 348/725   |
| 2003/0012313 | A1 | * | 1/2003 | Husted et al.  | 375/345   |
| 2003/0133521 | A1 | * | 7/2003 | Chen et al.    | 375/345   |
| 2003/0147481 | A1 | * | 8/2003 | Chen et al.    | 375/345   |
| 2003/0152173 | A1 | * | 8/2003 | Strolle et al. | 375/347   |
| 2003/0185321 | A1 | * | 10/2003| Harberts       | 375/349   |
| 2003/0198306 | A1 | * | 10/2003| Forrester      | 375/345   |
| 2004/0190658 | A1 | * | 9/2004 | Ohtaki et al.  | 375/347   |
| 2005/0163197 | A1 | * | 7/2005 | Cleary et al.  | 375/147   |
| 2005/0276358 | A1 | * | 12/2005| Pipilos        | 375/345   |
| 2007/0129034 | A1 | * | 6/2007 | Adams et al.   | 455/138   |

OTHER PUBLICATIONS

"Webster's II New Riverside University Dictionalry", published 1984 by Houghton Mifflin Company, p. 314.*

* cited by examiner

*Primary Examiner*—Phuong Phu
(74) *Attorney, Agent, or Firm*—Bever, Hoffman & Harms, LLP; Jeanette S. Harms

(57) ABSTRACT

A wireless local area network (WLAN) system can have multiple antennas to improve signal detection and decoding. A WLAN receiver in such a system includes multiple amplifiers that can appropriately size an incoming signal and an automatic gain control unit to process the received incoming signals. The amplifiers of a chain of the WLAN receiver, i.e. an antenna and associated receiver components, can be adjusted with computed gains. To optimize the wireless system detection and decoding, the automatic gain control unit can advantageously compute these gains for each amplifier in the WLAN receiver.

22 Claims, 11 Drawing Sheets

MULTI-CHAIN SIGNAL DETECTION AND GAIN CONTROL FOR AUTOMATIC GAIN CONTROL SYSTEMS

BACKGROUND OF THE INVENTION

1. Field of the Invention

The present invention relates to an automatic gain control (AGC) system and in particular to an AGC system using multi-chain signal detection and gain control.

2. Description of the Related Art

WLAN Receiver With Single Antenna: Overview

Receivers are ubiquitous circuits in wireless systems (e.g. such as wireless local area networks (WLANs)). FIG. 1 illustrates a simplified receiver 100 for receiving signals in a WLAN environment. In receiver 100, a bandpass filter 102 receives the incoming signals from an antenna 101 and outputs a predetermined band of frequencies (while excluding those frequencies higher and lower than the predetermined band). A variable gain RF amplifier 103 can provide an initial amplification to that predetermined band of frequencies. A mixer 104 converts those amplified signals (using a signal from a local oscillator) into intermediate frequency (IF) signals, which are then amplified by an IF amplifier 105.

In one embodiment, mixers 106 can include an in-phase mixer directly driven by a local oscillator and a quadrature mixer driven by the same local oscillator signal after it is phase-shifted by 90° in a phase shifter. In this way, in-phase (I) and quadrature (Q) components of the amplified IF signal are obtained at the outputs (only one shown) of mixers 106.

At this point, low-pass filters 107 (including both I and Q branches) can generate signals in the desired channel (called the baseband signals). Amplifiers 108 then amplify these baseband signals. Analog to digital converters (ADCs) 110 (provided for both the I and Q branches of low-pass filters 107) transform the amplified baseband signals into digital signals that can be analyzed by a processing block 111. ADCs 110 can be implemented as pipeline ADCs, sigma-delta converters, or any other mechanisms for converting analog signals to digital signals.

Of importance in receiver 100, less amplifier gain is needed for strong signals. Specifically, an amplified strong signal can distort incoming signals, thereby overloading and possibly damaging certain components (e.g. front-end components, such as the ADCs). For this reason, gain control 112 tries to maintain the amplified signals within certain ranges. Therefore, a gain control circuit 112 can be used to detect the magnitude of the digital signal, as measured by ADCs 110, and uses the detected magnitude to adjust the gains of RF amplifier 103, IF amplifier 105, and BB amplifiers 108. Notably, gain control 112 typically uses the same gain adjustment value for RF amplifier 103, IF amplifier 105, and BB amplifiers 108. To enhance the quality and performance of the wireless connection, it would be preferable to independently adjust the amplifiers in the receiver.

Moreover, some WLAN systems use multiple antennas to achieve diversity. Diversity can mitigate the effects of multipath. In multipath, one portion of a signal can travel directly to its destination and another portion of the signal bounces off an obstruction and then reaches the destination. Thus, in effect, portions of a signal take different paths. Portions of the signal taking the longer path can undesirably lose energy. Moreover, combining the received portions of the signal can result in some distortion, perhaps even causing bit errors in the signal. By using diversity, wherein the antenna having the strongest signal is selected, the WLAN system can increase the odds of minimizing multipath. Therefore, in a WLAN system having multiple antennas, gain adjustments are performed on the amplifiers based on information from the antenna receiving the strongest signal.

These "one size fits all" techniques fail to optimize amplifier performance. Therefore, a need arises for a WLAN receiver that can independently adjust all amplifiers, even those from multiple antennas, thereby optimizing the wireless connection.

SUMMARY OF THE INVENTION

A wireless local area network (WLAN) system can have multiple antennas to improve signal detection and decoding. A WLAN receiver in such a system includes multiple amplifiers that can appropriately size an incoming signal. The amplifiers of a chain of the WLAN receiver, i.e. an antenna and associated receiver components, can be adjusted with computed gains.

To optimize the wireless system, this gain can be advantageously computed for each amplifier in the WLAN receiver.

In accordance with one embodiment, a WLAN receiver can include first and second chains as well as a gain control to compute these gains. Specifically, the gain control can independently adjust a gain for each amplifier in the first and second chains.

The gain control can include first and second automatic gain control (AGC) pre-processors coupled to receive the processed signals from the first and second chains, respectively. The gain control can further include an AGC controller that receives the output signals from the first and second AGC pre-processors. The AGC controller provides control of each amplifier in the first and second chains.

In one embodiment, each AGC pre-processor can include a first filter that eliminates a DC component of the processed signal and a power detect unit. This power detect unit receives the output of the first filter and provides a first power value to the AGC controller. Each AGC pre-processor can further include a set of filters, a second power detect unit, and a correlator. The set of filters can reduce a required data-sampling rate, remove adjacent blockers, and eliminate a DC component of the processed signal. The second power detect unit receives an output of the set of filters and provides a second power value to the AGC controller. The first and second power values can determine whether a quick drop gain technique or a base gain control technique is performed on each chain as well as determine whether a received signal is within an acceptable range on at least one chain.

The correlator receives an output of the set of filters and provides a correlation value to the AGC controller. This correlation value relates to outputs from performing strong signal detection and/or weak signal detection.

A method of performing automatic gain control for a wireless local area network (WLAN) receiver having multiple chains is also provided. Each chain includes one or more antennas, a plurality of amplifiers for amplifying a signal received by the antennas and processed by the chain, and an analog to digital converter (ADC). In this method, if an incoming signal is not saturating an ADC of any chain, then a base gain control technique is performed on a set of the plurality of amplifiers for each chain.

The base gain control technique can include determining whether a total digitized power at outputs of the ADCs is greater than a predetermined maximum power. If so, then a coarse gain adjustment for a set of the plurality of amplifiers in each chain is decreased. On the other hand, if the total digitized power at the outputs of the ADCs is less than or equal to a predetermined minimum power, then a coarse gain adjustment for a set of the plurality of amplifiers in each chain is increased.

If an incoming signal is saturating an ADC of any chain, then a quick drop gain control technique is performed on a set of the plurality of amplifiers for each chain. The quick drop gain control technique can include setting a high ADC output threshold and a low ADC output threshold. The high ADC output threshold is close to but less than a maximum ADC output value that designates saturation on a high side, whereas the low ADC output threshold is close to but greater than a minimum ADC output value that designates saturation on a low side. At this point, a number of instances in a sample window that an ADC output exceeds the high/low ADC output thresholds can be counted. If the number of instances exceeds a predetermined threshold, then a predetermined gain drop can be performed on all chains.

Performing either of the base gain control technique or the quick drop gain control technique results in a quantized signal. If the quantized signal is within a preferred range on either chain, then a current gain is maintained for the plurality of amplifiers on all chains. If the quantized signal is not within a preferred range on either chain, then the method can return to determining if an incoming signal is saturating an ADC of any chain.

Once the quantized signal is within a preferred range on either chain, the method can determine whether a packet is detected. This packet detection can be performed using weak signal detection and/or strong signal detection. If a packet is detected, fine gain adjustment can be performed on a set of the plurality of amplifiers on all chains.

Weak signal detection can include performing self-correlation on each chain, weighting self-correlation values on each chain, and combining weighted self-correlation values from all chains. At this point, the combined weighted self-correlation values can be normalized. If the normalized result exceeds a self-correlation threshold, then a weak signal is detected.

Strong signal detection can include determining whether the incoming signal is substantially in-band on any of the chains. If the incoming signal is substantially in-band on any of the chains, then the fine gain adjustment can be performed on all chains. If the incoming signal is not substantially in-band on any of the chains, then the method can return to determining if an incoming signal is saturating.

A system for performing automatic gain control for a wireless local area network (WLAN) receiver having multiple chains is also provided. This system can include means for performing each of the above steps. In one embodiment, these steps can be implemented using software code that runs on a conventional general purpose computer, a specialized digital computer, or a microprocessor. Other embodiments can implement one or more portions of the above techniques using application specific integrated circuits (ASICS) or by interconnecting an appropriate network of conventional component circuits. In addition, any steps implemented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s).

DETAILED DESCRIPTION OF THE FIGURES

WLAN Receiver With Multiple Antennas: Overview

Figure 1:
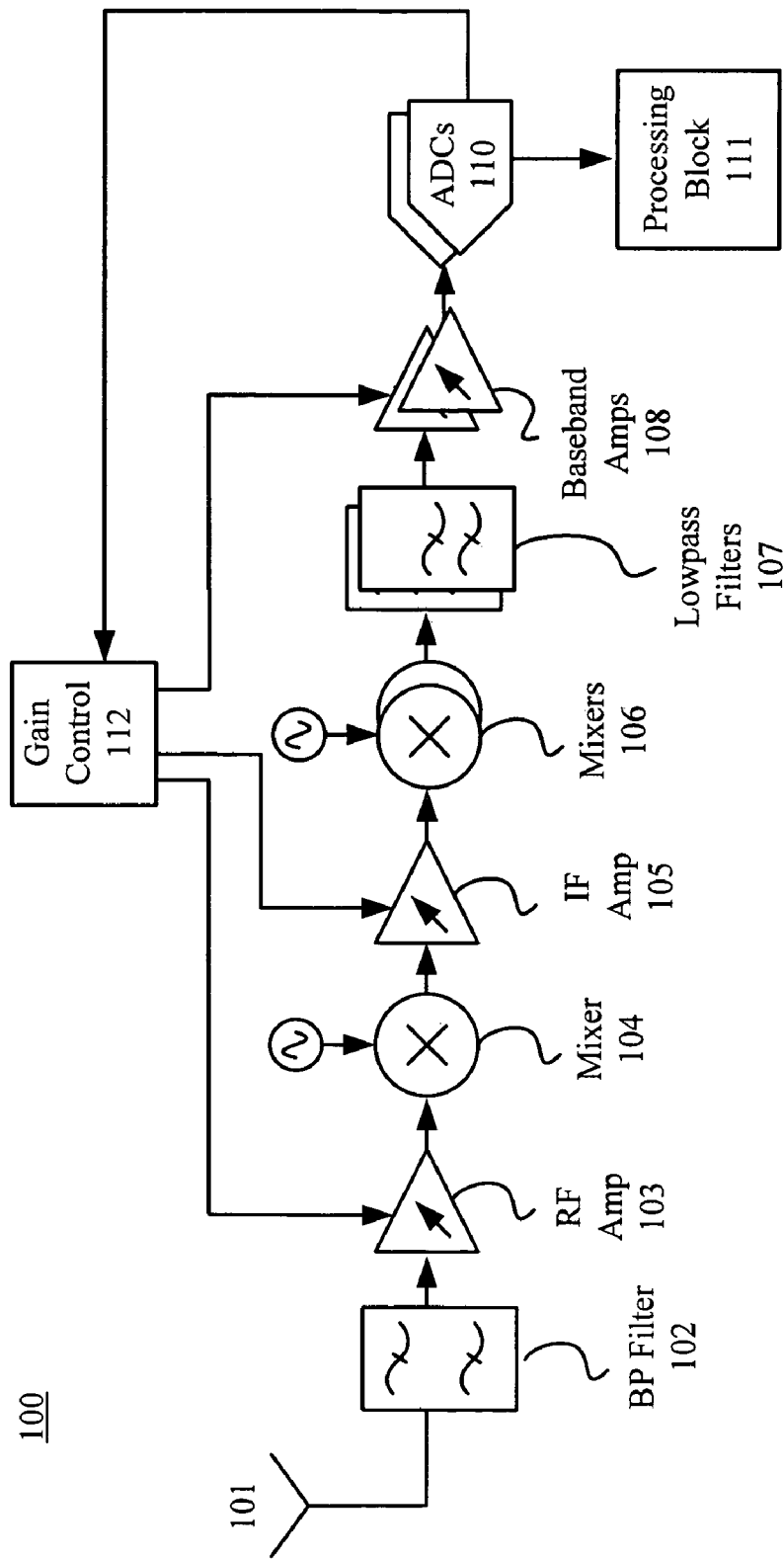
FIG. 1 illustrates a simplified WLAN receiver for receiving signals via a single antenna.
Figure 2:
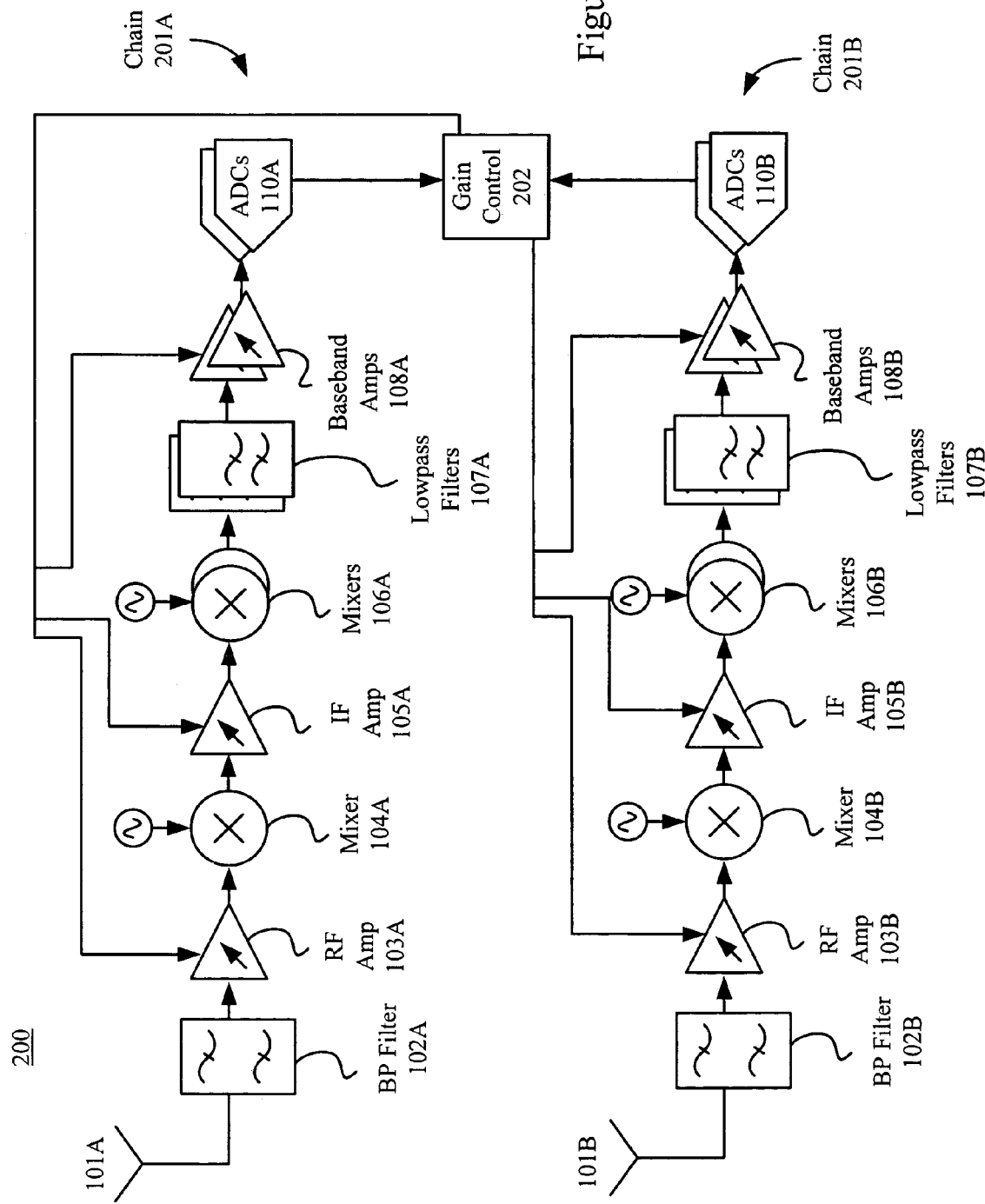
FIG. 2 illustrates a simplified WLAN receiver that can receive signals from multiple antennas.

Some WLANs use multiple antennas to achieve diversity of the wireless connection. FIG. 2 illustrates a simplified WLAN receiver 200 that can receive signals from multiple antennas. A "chain" as used herein comprises an antenna and its associated analog front-end unit. For example, chain 201A includes antenna 101A, BP filter 102A, RF amplifier 103A, mixer 104A, IF amplifier 105A, mixers 106A, low-pass filters 107A, baseband amplifiers 108A, and ADCs 110A (all previously described in reference to FIG. 1). Chain 201B includes similar components as chain 201A.

In this embodiment, a gain control 202 receives the output signals from both ADCs 110A and 110B. The power associated with these signals can be used to provide the appropriate gain adjustment for each chain. Moreover, gain control 202 can advantageously apply gain adjustments independently for amplifiers within each of chains 201A and 201B, e.g. the gain adjustment for RF amplifier 103A could be different from the gain adjustment for RF amplifier 103B.

AGC Controller With AGC Pre-Processors

In accordance with one feature of the invention, an automatic gain control (AGC) controller can receive multiple processed signals from the ADCs. These multiple processed signals allow the AGC controller to accurately compute gain adjustments for amplifiers in the receiver.

Figure 3:
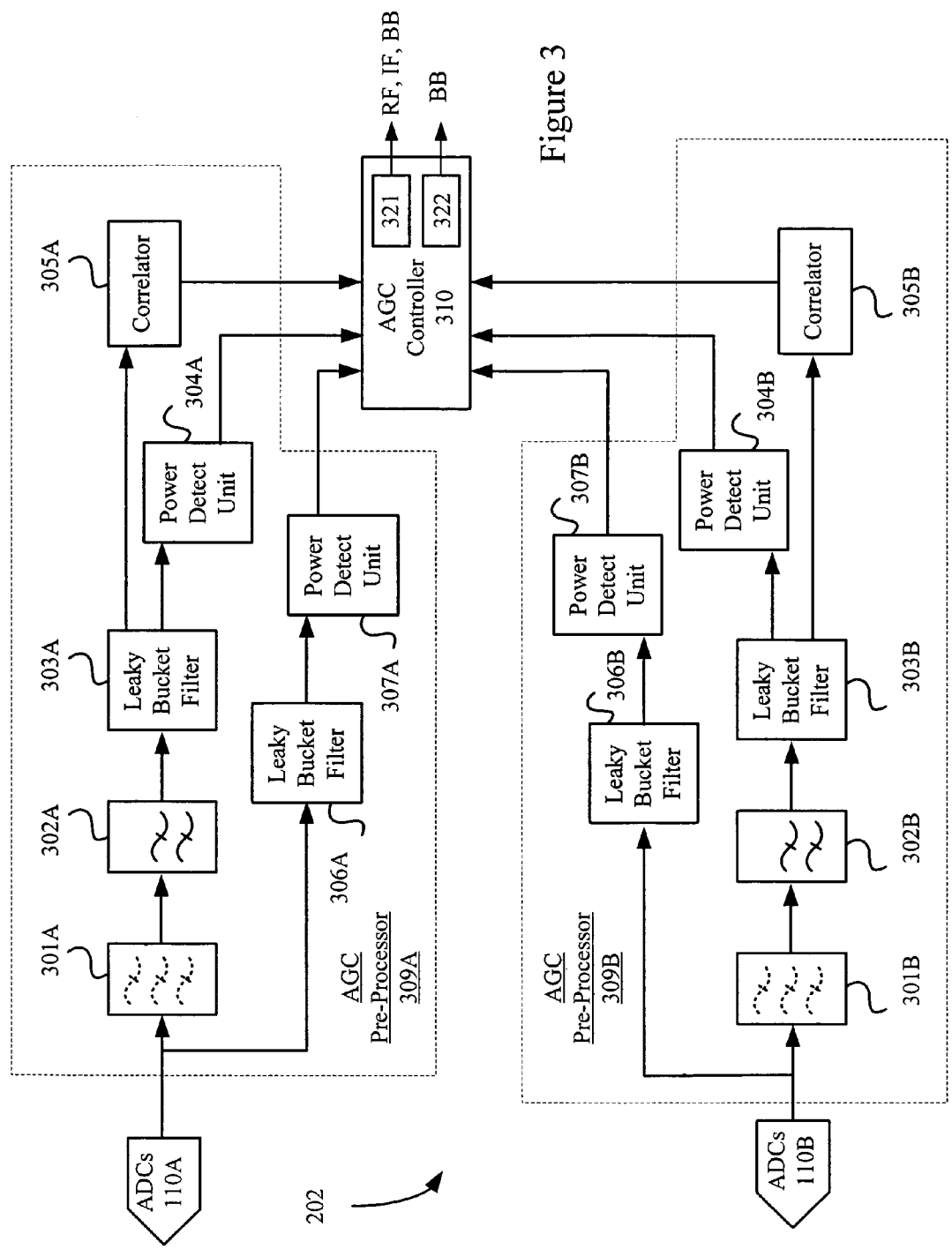
FIG. 3 illustrates an AGC controller that can receive signals from multiple AGC pre-processors.

FIG. 3 illustrates an exemplary gain control 202 in which an AGC controller 310 receives multiple signals from AGC pre-processor 309A and AGC pre-processor 309B. In this embodiment, AGC pre-processor 309A receives its input from chain 201A (FIG. 2)(indicated by ADCs 110A, other components not shown) whereas AGC pre-processor 309B receives its input from chain 201B (FIG. 2)(indicated by ADCs 110B, other components not shown). Note that AGC pre-processors 309A and 309B have substantially similar components. Therefore, for simplicity, such components will be referenced numerically without pre-processor designation, e.g. AGC pre-processor 309 will refer to either of AGC pre-processors 309A and 309B.

The digitized signals from the ADCs 110 are passed through a decimation filter 301, low-pass filter 302, and a leaky bucket filter 303. In one embodiment, described in further detail herein, these filters can be implemented using digital FIRs, although other types of filters (e.g. analog filters, etc.) can be used. Note that if the system is not oversampled, then the filters are preferably analog.

A decimation filter can advantageously eliminate every other sample from its stream, thereby reducing the data-sampling rate (e.g. from 80 MHz to 40 MHz for a normal 8.5 MHz single-sided bandwidth packet). Low-pass filter 302 can be used to remove any interfering signals, such as adjacent or aliased blockers. Leaky bucket filters 303 and 306 can advantageously cancel out a DC component of an ADC output. A power detect unit 304 can measure the power of the signal output by leaky bucket filter 303. Similarly, a power detect unit 307 can measure the power of the signal output by leaky bucket filter 306. A correlator 305 can perform self-correlation on the output of leaky bucket filter 303.

AGC controller 310 can advantageously use the power measurements from power detect units 304 and 307 as well as the correlation results from correlator 305 to control gain adjustments and DC offset for the amplifiers in the receiver. For example, AGC controller 310 can control a gain control generator 321, which in turn controls output analog gain control signals for each of RF amplifiers 103, IF amplifiers 105, and baseband amplifiers 108. In one embodiment, AGC controller 310 can provide an N-bit control word (e.g. a 10-bit control word can provide approximately 10 levels, thereby accommodating good range and resolution of gain adjustment values) with a defined format to gain control generator 321, which triggers gain control generator 321 to output the appropriate control signals for the amplifiers, thereby adjusting their gain as needed. In one embodiment, gain control generator 321 can provide a dynamic range of 93-51 dB for the RF and IF amplifiers and 42 dB for the baseband amplifiers.

AGC controller 310 can also control a DC offset control unit 322 that provides analog offset control signals to baseband amplifiers 108. DC offset control can be advantageously done to ensure that the analog signals provided to baseband amplifiers 108 and ADCs 110 are properly centered and quantized.

In one embodiment, AGC controller 310 can be implemented using an application-specific integrated circuit (ASIC). In another embodiment, an appropriately programmed processor (embedded or discrete), programmed logic device (FPGA etc.), or another computer-assisted device may be used to implement AGC controller 310. Note that although FIG. 3 shows various components integrated in AGC controller 310, i.e. gain control generator 321 and DC offset generator 322, these components can also be implemented separately from AGC controller. Further note that one or more devices can implement the components in AGC preprocessor 309. For example, in one embodiment, an appropriately programmed processor can perform the functions of decimation filters 301, low-pass filters 302, power detectors 304/307, as well as correlators 305. In other embodiments, one or more of these components can be implemented in dedicated hardware.

AGC Controller Operation: Overview

Figure 4A:
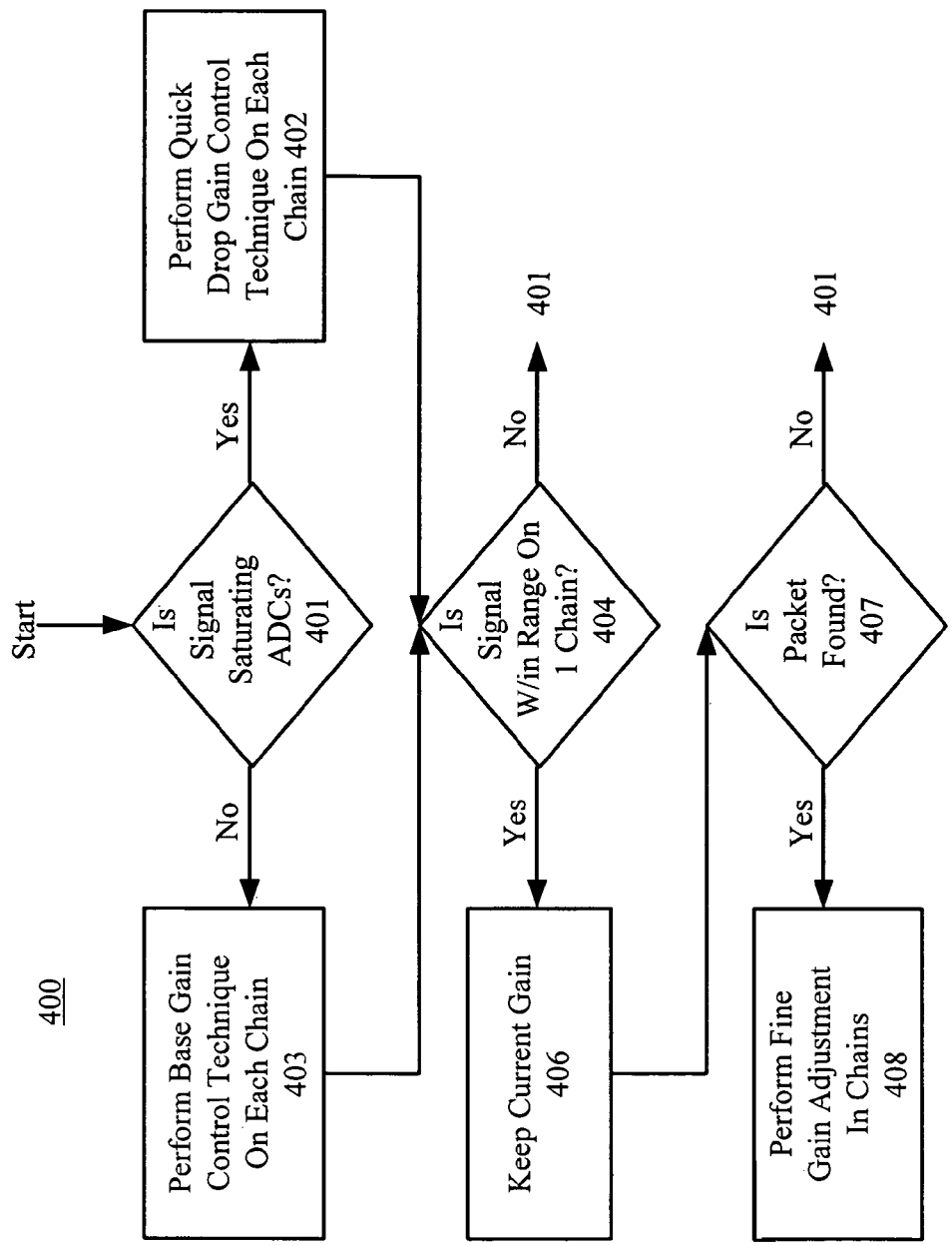
FIG. 4A illustrates a simplified AGC controller process.

FIG. 4A illustrates a simplified AGC controller process 400 that can be performed simultaneously on multiple chains. In this embodiment, the AGC controller logic begins in step 401 by determining if the incoming signal is saturating either of the ADCs on any chain. If so, then step 402 can perform a quick drop gain control technique for each chain. If not, then step 403 can perform a base gain control technique for each chain. In general, steps 402 and 403 ensure that the incoming signal can be properly quantized by the ADCs. Note that steps 401, 402, and 403 can be performed using power measurements provided by ADCs 110 (e.g. a positive, averaged value) and analyzed by power detect units 307.

Next, the AGC controller can determine whether the quantized signal (resulting from the base gain control technique or the quick drop gain control technique incoming signal) is within a preferred range on either chain (as determined by power detect units 307) in step 404. If so, then no gain control is needed and step 406 can keep the current gain on all chains. If not, then process 400 returns to step 401. This gain control loop continues until the incoming signal is properly sized on at least one chain. Note that overcoming saturation may require multiple consecutive gain drops.

At this point, the AGC controller can determine whether a packet is detected in step 407 using the output of correlators 305 (i.e. from all chains). If a packet is found, then step 408 can perform fine gain adjustment on components (e.g. amplifiers) of the appropriate chains. Otherwise, the AGC controller can return to step 401 to analyze the next incoming signal.

AGC Base Gain Control Technique

The AGC controller can advantageously adjust the amplifiers' gains so that the incoming signal can be properly quantized by the ADCs. Note that if the incoming signal is too big at the input of the ADCs, then the signal may be distorted by saturation. In contrast, if the incoming signal is too small at the input of the ADCs, then the quantization noise of the ADCs may render the received signal-to-noise (S/N) ratio too low for correct detection.

To determine whether the incoming signal is correctly sized at the ADCs (step 401), the AGC controller can estimate the total digitized power at the ADCs. In one embodiment, the total digitized power can be computed by summing a window of instantaneous power calculations for half of a preamble short symbol window. In an IEEE 802.11a/g signal, this sample window would provide a total of 16 samples (400 ns). For example, consider a signal coming out of nine-bit ADCs with a range of [−256, 255], and measurement of power for this signal over a 16-bit sample window in half a preamble short symbol window. To perform this measurement, the AGC controller can calculate the total digitized power adcpwr1(i) on the ADC output stream adcoutput$_i$ as $$adcpwr1(i) = \sum_{k=0}^{15} (\text{real}(adcoutput_i[k]))^2 + (\text{imag}(adcoutput_i[k]))^2$$

where (i) is the chain index, "real" refers to the real or in-phase (I) power component and "imag" refers to the imaginary or quadrature (Q) power component. This total digitized power measurement can then be put into a log table where its maximum value is zero. Thus, for a fully railed output with every value at −256, the logarithmic table output would be zero. The power of a full-rail sinusoid would be −3 dB (RMS voltage of a sinusoid is peak voltage/1.414; RMS power is thus peak power/2 or −3.01 dB); if every sample were 128, the power would be −6 dB (each halving of power represents −3.01 dB; halving amplitude (which must be squared to calculate power) thus represents a fourfold reduction in power, or −6.02 dB), etc.

Figure 4B:
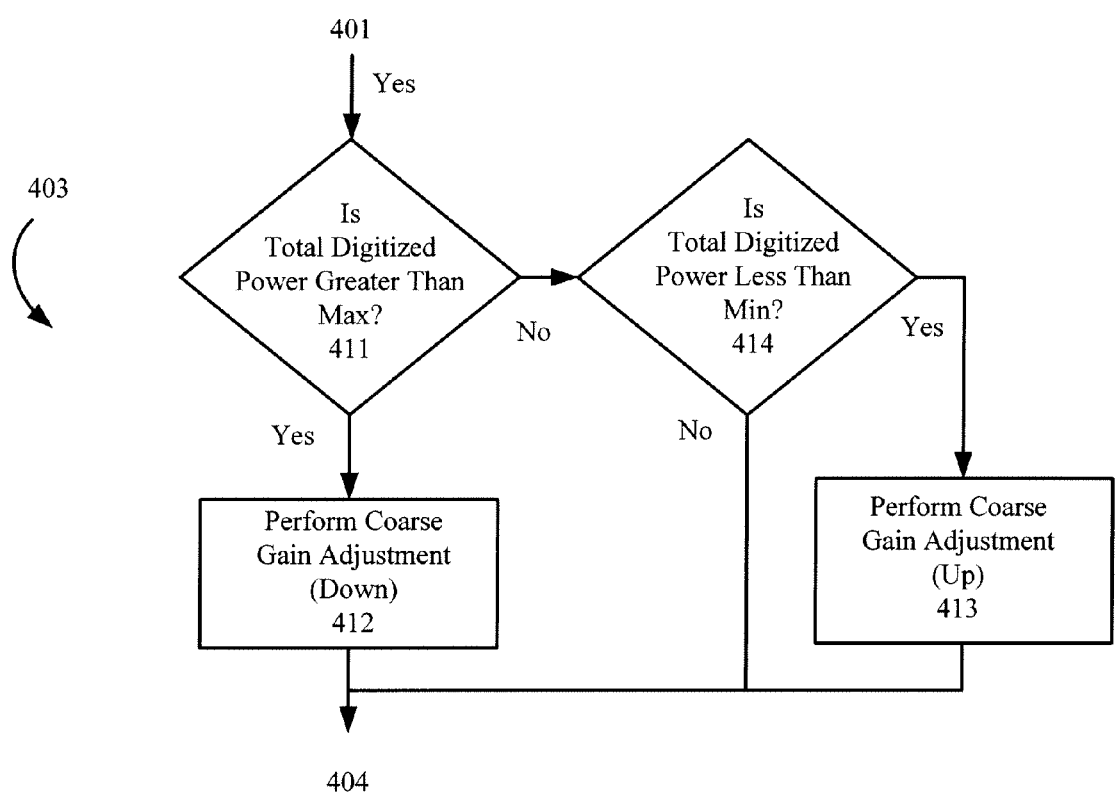
FIG. 4B illustrates an exemplary base gain control technique.

The AGC controller can use this total digitized power to determine whether the signal is in range at the ADCs. More specifically and referring to FIG. 4B, which illustrates an exemplary base gain control technique 403, if the total digitized power is determined to be out of range, but not continuously saturating one or more of the ADCs, a coarse gain change (down or up) can be made to put the signal back in range.

For example, if the AGC controller detects the total digitized power adcpwr1 (in one embodiment, within the range −63. −0 dB) is greater than a predetermined maximum total power (called coarse_high herein) desired value in step 411, for either of the chains, then in step 412 the AGC controller can reduce a desired gain value Gaintarget, for each chain, according to the following equation:

Gaintarget($i$)=gaintarget($i$)+(coarsepwr_const−$adcpwr1(i)$))

where coarsepwr_const is an additional gain for a coarse gain drop (e.g. −17 dB) and (i) is the chain index, and gaintarget(i) is an assumed value, e.g. the last AGC gaintarget value.

As shown by the above equation, the gain can be reduced by more than the gaintarget value, i.e. a very aggressive drop. Specifically, the difference between the empirically determined coarsepwr_const power and the total digitized power adcpwr1 is added to the gaintarget to increase the gain drop, thereby facilitating a quicker convergence to the total size desired power 502. Note that gain control unit 321 (FIG. 3) can generate the appropriate control signals for the amplifiers based on the computed Gaintarget value.

On the other hand, if the AGC controller detects the total digitized power adcpwr1 is not greater than a predetermined maximum total power, then the AGC controller can determine whether the total digitized adcpwr1 is less than a predetermined minimum total power (called coarse_low herein) desired value in step 414. If so, then the AGC controller can increase a desired gain value Gaintarget for each chain in step 413, according to the following equation:

Gaintarget($i$)=gaintarget($i$)+(totalsizedesired−$adcpwr1(i)$)

where totalsizedesired is the target ADC signal size during coarse gain changes, and (i) is the chain index. If the total digitized adcpwr1 is not less than a predetermined minimum total power, then the process proceeds to step 404 without any gain adjustment.

Figure 5:
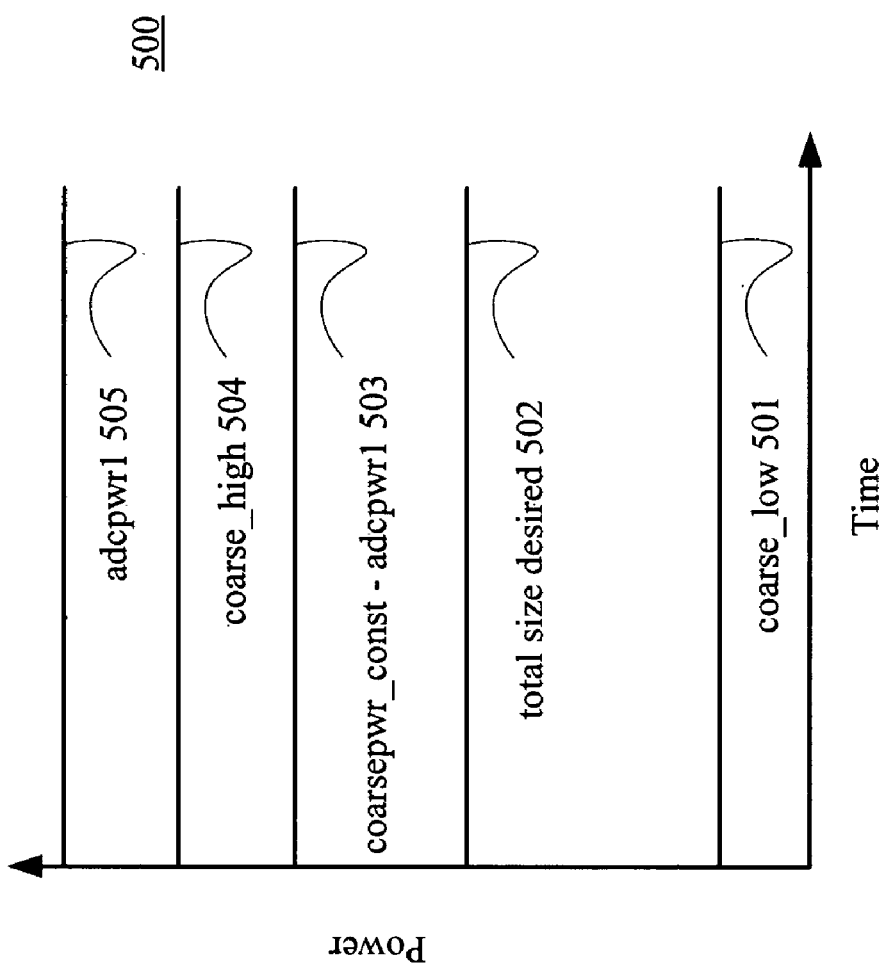
FIG. 5 illustrates a graph indicating the relative powers of various signal parameters when the total digitized power at the ADC input is greater than a predetermined maximum total power.
Figure 6:
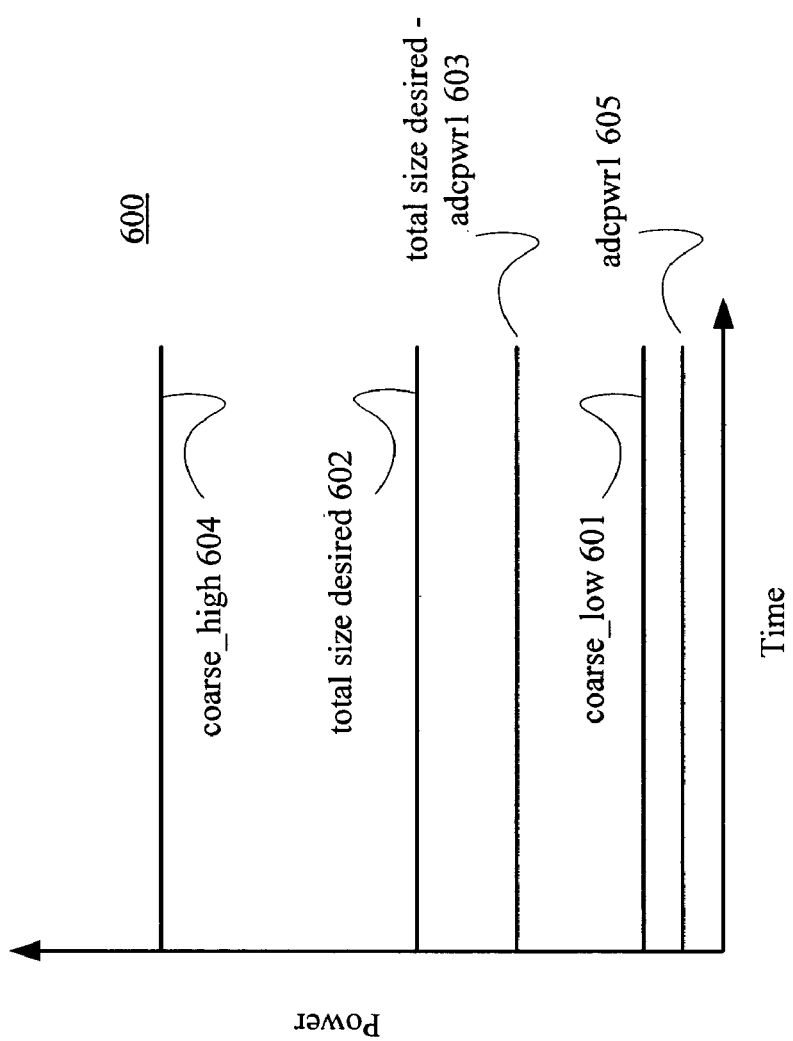
FIG. 6 illustrates a graph indicating the relative powers of various signal parameters at the ADC input when the total digitized power is less than a predetermined minimum total power.

FIG. 5 illustrates a graph 500 indicating the relative powers of various signal parameters when the total digitized power at the ADC input is greater than a predetermined maximum total power. An exemplary coarse high power 504 and coarse_low power 501 are shown for context. In this case, a coarse gain adjustment is desirable because the incoming signal (as measured by adcpwr1 power 505) may be too large to quantize (e.g. the signal saturates occasionally), but not large enough to trigger a quick drop as described in reference to step 402 (FIG. 4A). FIG. 6 illustrates a graph 600 indicating the relative powers of various signal parameters at the ADC input when the total digitized power adcpwr1 is less than a predetermined minimum total power.

AGC Quick Drop Gain Control

Notably, even if incoming signals only intermittently saturate any of the ADCs, then a precise power measurement may not be obtained. In other words, even if the incoming signals are not continuously saturating any of the ADCs (as determined in step 401, it would be desirable to correct the gain to compensate for intermittent out of range signals.

In accordance with one embodiment, certain information can be captured and used to quickly adjust the gain as necessary. For example, the AGC controller can use a saturation counter to count the number of saturations adcsat of the ADC outputs (I and Q). A pair of variable saturation thresholds adcsat_thrh and adcsat_thrl can be used to counter any possible lack of ADC range. In one embodiment, an intermittent saturation can be detected if $adc\text{output}(i) \geq (adcsat\_thrh+192)$ or if $adc\text{output}(i) \leq (adcsat\_thrl-256)$ where (i) is the chain index, adcsat_thrh is a high threshold less than the maximum ADC output value that designates saturation on the high side of the ADC output, and adcsat_thrl is a low threshold value greater than the minimum ADC output value that designates saturation on the low side of the ADC output. Note that the adjustment values of 192 and 256 can be implementation-dependent and could be derived through simulation and/or actual circuit testing.

Figure 7:
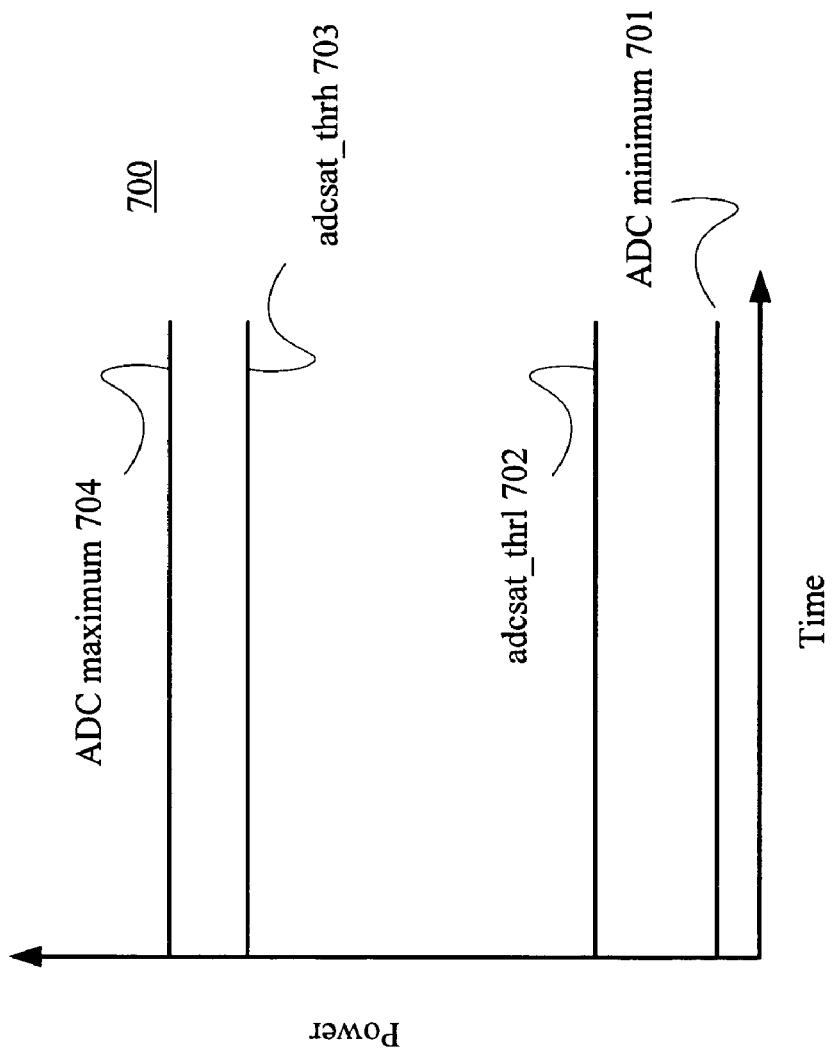
FIG. 7 illustrates a graph indicating the relative powers of exemplary signals that can be set at the ADC input for a periodic saturation event.

FIG. 7 illustrates a graph 700 indicating the relative powers of exemplary adcsat_thrh, adcsat_thrl, ADC maximum, and ADC minimum signals that can be set at the ADC input for a periodic saturation event. As shown in graph 700, adcsat_thrh can be set to be slightly less than the ADC maximum output, whereas adcsat_thrl can be set slightly higher than the ADC minimum output. Using these settings advantageously allows signals that are close to saturation of, but do not actually saturate the ADCs, to be classified as saturation signals, thereby facilitating gain adjustment even under these circumstances. If the number of saturations during a sample window of adcsat_icount cycles (e.g. less than or equal to eight, the number of cycles in the quarter-symbol 802.11a/g measurement window) exceeds adcsat_thresh on one or more of the chains, then the AGC controller can instruct each chain to perform a quick gain drop, wherein gaintarget(i) is reduced by a predetermined amount quick_drop(i) (e.g. a −30 dB change in gain) where (i) is the chain index. Note that the amount of quick_drop could be different on different chains.

Specifically, some chains may be saturated less frequently than other chains and therefore would not need not to have a gain drop as much as the chains that are saturated more frequently. In one embodiment, the chain that exhibits the most frequent saturation events will receive a particular quick drop adjustment and the other chain(s) will receive another (typically smaller) quick drop adjustment. In another embodiment, all chains could receive a predetermined gain drop.

The quick drop technique can be implemented in the following manner. After any gain change, an AGC settling time occurs. This settling time, which begins after adcpwr1 is reset and an acc_count counter (e.g. an eight-bit incremental counter cycling continuously during AGC operation) is reset, can be determined by the AGC controller decrementing a gc_count variable (as described in greater detail below with reference to weak signal detection).

The following events can be set to happen based on the value in a counter acc_count:

mod(acc_count, 16)=0: reset adcpwr1 accumulator mod(acc_count, 16)=1: clear reset on adcpwr1 accumulator mod(acc_count, 16)=2: store adcpwr1 mod(acc_count, 16)≦adcsat_icount and adcsat=1 (asserted when set_thresh saturations have been counted), the saturation counter has exceeded adcsat_thresh, and a quick gain drop should be executed.

Packet Detection

After the incoming signal is in range on at least one chain, as determined in step 404 (FIG. 4A), the AGC controller can attempt to detect a packet in step 407. To do this detection, the AGC controller can first determine an in-band power estimation using various FIR filters (e.g. decimation filters 301, low-pass filters 302, and leaky bucket filters 303) as well as power detect units (e.g. power detect units 304 and 307).

Figure 8:
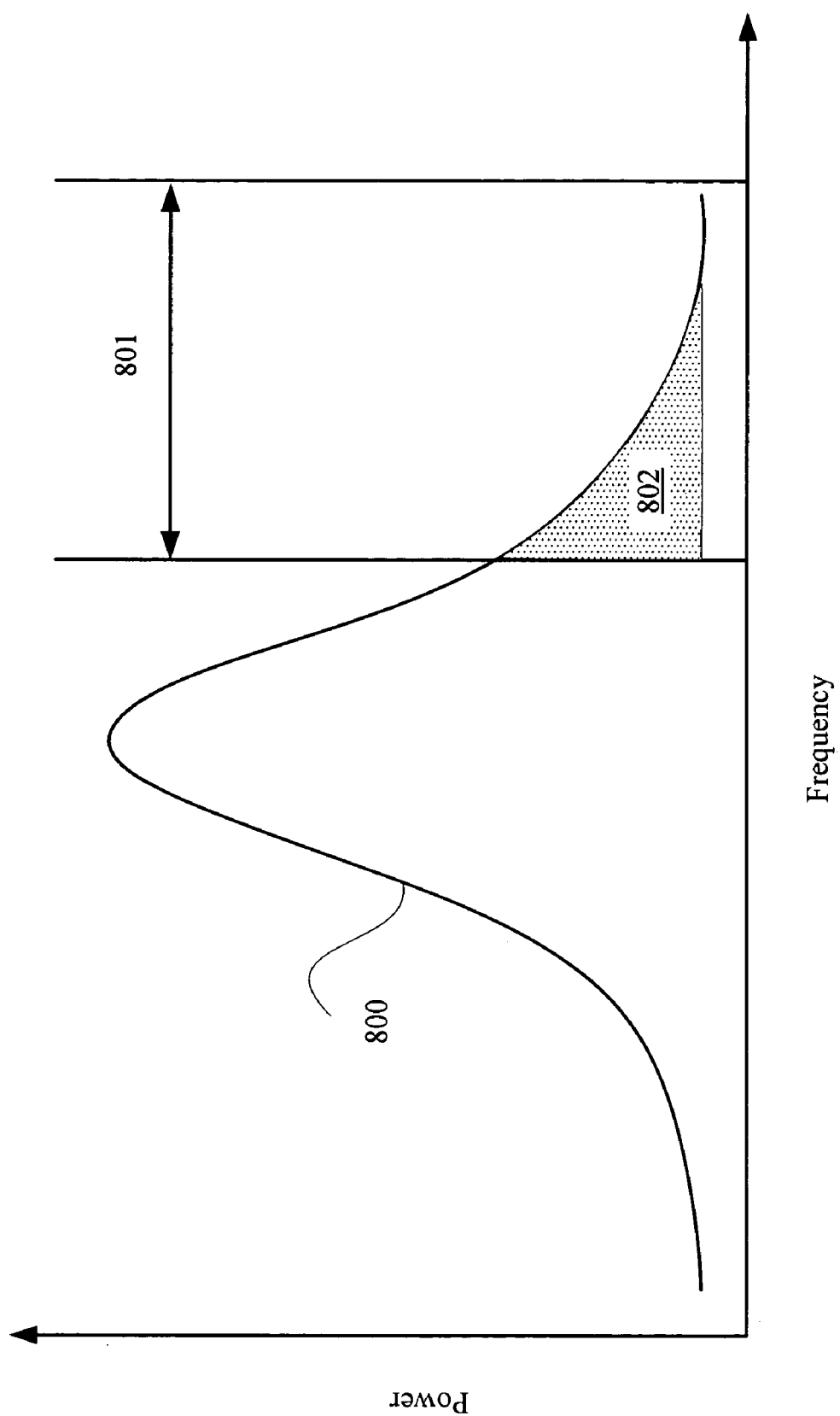
FIG. 8 illustrates an ADC output signal before and after filtering.

For example, the overall power of an ADC output signal, such as signal 800 shown in FIG. 8, might be computed to be 100 μW. Passing through one or more filters having a frequency band of 801 could result in a remaining signal 802 (represented by a shaded portion of the curve)(wherein residual portions of the signal outside frequency band 801 are not shown). In this example, the original signal 800 loses approximately 80% of its power and is reduced to a level of about 15 μW. Because the filter(s) blocked most of the signal's power, the AGC controller can assume that signal 800 was out-of-band.

Figure 9:
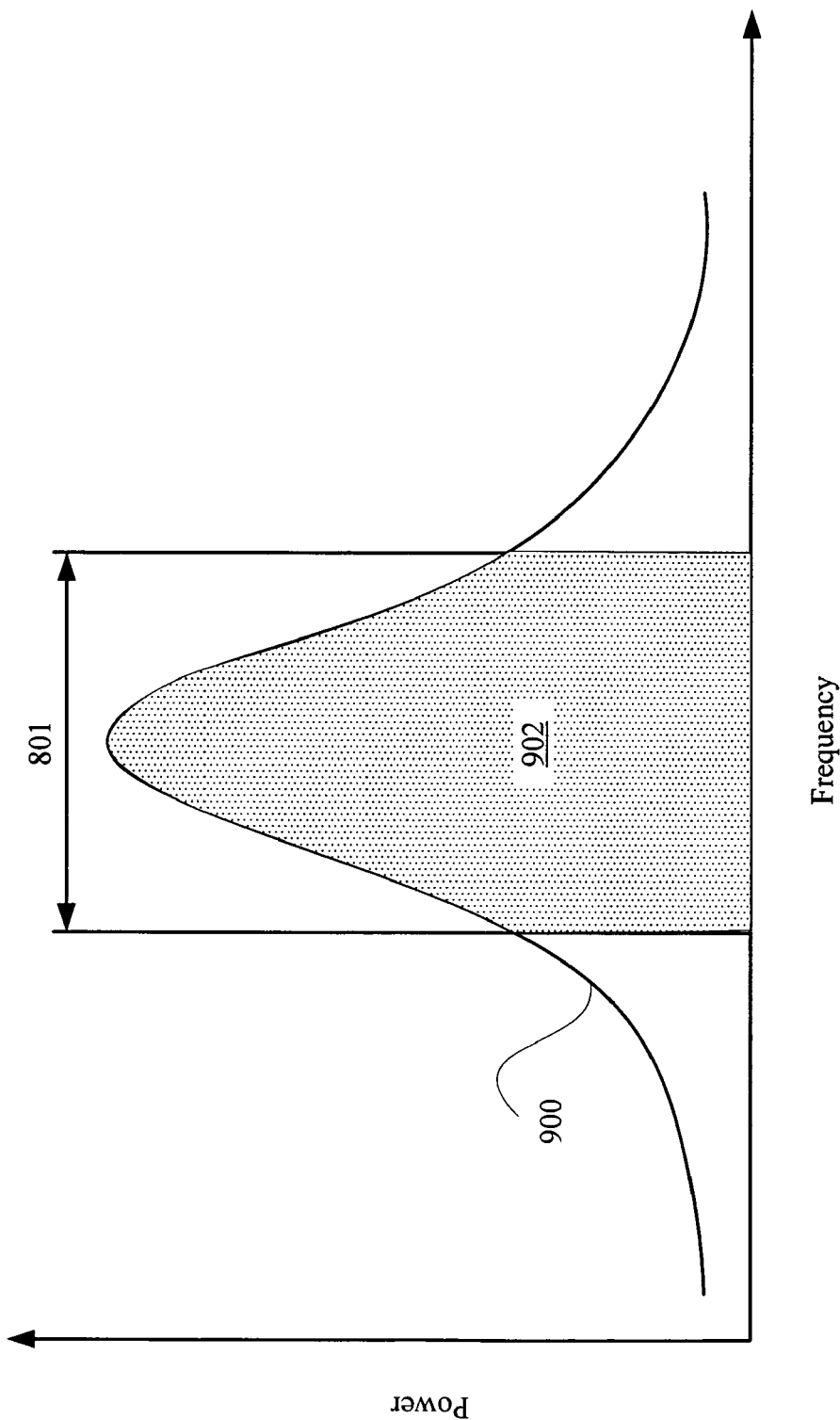
FIG. 9 illustrates the same ADC output signal before and after filtering different than that shown in FIG. 8.

However, a different signal 900 passing through the same filters (i.e. having a frequency band of 801), as shown in FIG. 9, could result in a remaining signal 902 (also represented by a shaded portion of the curve, wherein residual portions of the signal outside frequency band 901 are not shown). In this example, signal 900 loses only 10% of its power and is reduced to a level of about 90 μW. Because the filter(s) blocked little of the signal's power, the AGC controller can assume that signal 900 was in-band.

In one embodiment, the in-band power can be calculated as the sum of instantaneous power measurements in a 32 sample in a 0.8 μs window (similar to the overall power calculation adcpwr1 described above). Power detect units 304 and 307 can use two measurements: firpwr_all (i) and firpwr1(i), wherein (i) is the chain index. The measurement firpwr_all (i) means all samples from a time domain signal (e.g. 28 or 32 samples) can be used in computing the detailed power measurement.

In contrast, the measurement firpwr1(i) means that a limited number of samples can be used in computing the detailed power measurement. For example, in one embodiment, the lowest 28 out of 32 samples in the 32-sample window can be used. This limited sampling can be used during periods of interference at symbol boundaries. Specifically, when interference is present adjacent a signal, a temporary in-band power spike may occur. Specifically, high-frequency components of interferers at the symbol transition may become in-band components in the frequency band, thereby erroneously show up as a step in the in-band power. Low-pass filtering as well as "windowing", a process that computes a value that is half the previous value added to half the subsequent value, can somewhat reduce this occurrence. Unfortunately, some high frequency peaks due to adjacent interference, although not occurring as frequently, can still exist.

Therefore, in one embodiment, to eliminate such high frequency peaks, the lowest 28 of the 32 samples can be used. In this manner, the temporary in-band power spike can be nulled out by not counting those values. Note that thresholds can be adjusted accordingly to compensate for the reduced power measurement due to the missing four samples.

Using firpwr_all(i) and firpwr1(i), packets can be found (see step 407 in FIG. 4A) in two ways: strong signal detection and weak signal detection.

Strong Signal Detection

When a base gain drop or quick gain drop (i.e. steps 402 and 403) occurs, the AGC controller can set a flag strongsignal. This flag can remain high until the signal is determined to be within range at the ADCs (step 404). At this point, the AGC controller can proceed to make the firpwr1 measurements on all chains. Using the firpwr1 measurements, another measurement flag_relpwr(i) can be calculated as:

$$\text{flag\_relpwr}(i) = (\text{firpwr1}(i) > \text{relpwr} + \text{adcpwr})$$

where (i) is the chain index and relpwr is an empirical threshold variable related to the absolute digital size of the in-band signal relative to the absolute total digital signal at the ADC). If flag_relpwr(i) is high on any of the chains and strongsignal is high, then a new, very strong in-band signal (in effect, a packet) has been found. In this manner, an over-sampled incoming signal having digitized frequencies beyond a desired frequency range due to over-sampling can be examined, i.e. the signal can be examined to determine whether most of its power is in-band before determining that a desired signal (i.e. a packet) has been found.

When flag_relpwr(i) is high on any of the chains and strongsignal is high, the signal_found flag can be asserted, thereby triggering a fine gain adjustment (step 408, FIG. 4A). The AGC process is completed once the number of consecutive gain changes is equal to or greater than the minimum number of gain changes deemed to constitute a successful AGC operation, i.e. when there have been enough gain changes to ensure a full programmable amplifier ramp-up when the system is turned on.

Weak Signal Detection

Figure 4C:
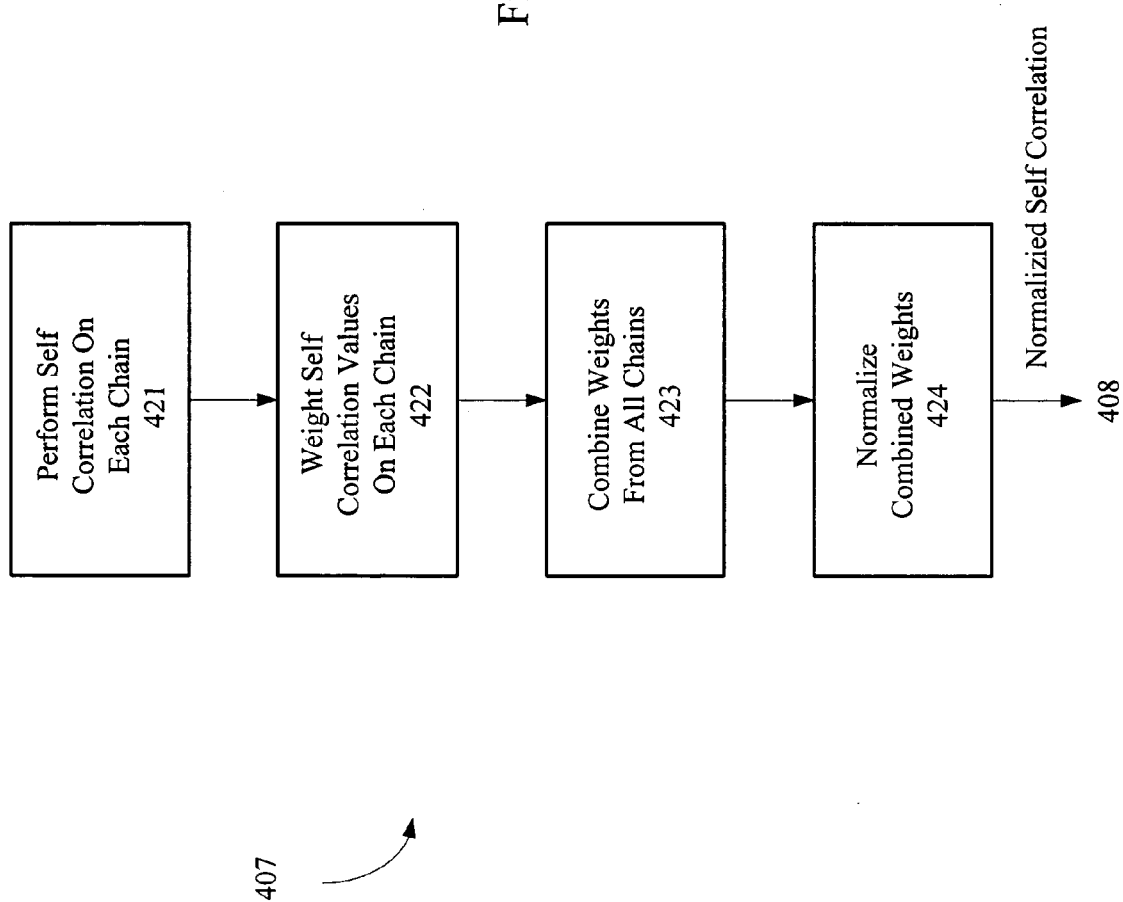
FIG. 4C illustrates an exemplary packet detection technique using weak signal detection.

In one embodiment, a weak signal detection technique can be performed concurrently with the above-described strong signal detection technique. FIG. 4C illustrates an exemplary packet detection technique (see step 407, FIG. 4A) using weak signal detection. In weak signal detection, correlators 305 (FIG. 3) can first compute the self-correlation of each chain in step 421 and then weight the self-correlation values on each chain in step 422 (i.e. a stronger chain signal would have a larger weight than a weaker chain signal). The weighted self-correlations can then be combined in step 423 and the combined weighted self-correlation normalized to the combined self-correlation power in step 424. In one embodiment, the normalized self-correlation can be measured to detect any in-band signal with a periodicity of 0.8 μs.

In one embodiment, the AGC controller can wait for the normalized self-correlation to exceed a first self-correlation magnitude threshold value m1thres. To do this, the correlators (e.g. correlators 305) can measure self-correlation of 802.11a/g packets by taking 32 samples in a short signal at the beginning of a packet and comparing it to a corresponding sample in the preceding short signal. More specifically, the self-correlation of an ADC stream adcoutput is given by $$\text{self\_corr} = \frac{\left[\sum adcoutput[n] \cdot conj(adcoutput[n-32])\right]^2}{\sum adcoutput[n]^2}$$

where the denominator is a normalization factor. In this equation, the numerator will be relatively high when x[n] and x[n−32] are identical and relatively low when they are 90° out of phase. Thus, this measure can serve as a good indicator of self-correlation.

Detecting when the self-correlation output exceeds m1thres can detect incoming packets. However, this technique can also detect interferers, which sometimes also have self-correlating characteristics. Therefore, in one embodiment, after the normalized self-correlation exceeds m1thres, the AGC controller can enter a loop and for m1count_max (a window length for the self-correlation count) cycles counts in a variable m1tally the number of times the normalized self-correlation exceeds a second normalized self-correlation magnitude threshold value m2thres. (Note that m1thres and m2thres can be derived through simulation or by actual circuit testing.) If mitally>m2count_thr and a threshold of the count of normalized self-correlation>m2thres, both occurring before m1count_max cycles have elapsed, then a weak signal is detected. In other words, the number of times a second threshold is exceed in a given window is counted to further determine if that in-band signal is a desired (i.e. packet) signal.

Note that the windowing process based on m1count_max described above can be used because both interferers and noise may have a self-correlation that momentarily exceeds a threshold; however, the chances of this occurring diminish when a window is applied. (That is, windowing can advantageously reduce the chances of noise and blocker's self correlation exceeding the signal detection threshold.) For example, if two similar adjacent 802.11a/g symbols are sent, then the last 0.8 μs of the first packet can exactly match the next 0.8 μs guard period of the next symbol, thereby creating self-correlation. However, the resulting spike will rapidly fade compared with a preamble where a flat normalized self-correlation result is expected for the preamble duration.

For further robustness against thermal noise and interferers, another embodiment can require that the weak signal detection result (i.e. the normalized self-correlation) be "enabled" before it is used. For example, to be enabled, the potential detected packet must increase the in-band signal power by at least a certain amount (as measured by power detect units 304) and that increase be proportional to (or greater than) any increase in the total signal power (wherein the signal power is at least a predetermined minimum size). This enablement provides extra sensitivity if the incoming in-band signal comes in below an interferer or near the noise floor, and thus does not trigger strong signal detection but could still be a weak signal.

Several events may stop weak signal detection from occurring even after m1tally>m1thresh. For example, if the value ycOK stored by a decrementing counter is equal to 0, then weak signal detection will not occur. Note that this decrementing counter can be reset to ycOKmax (e.g. four) to enable weak signal detection if it is determined that an increase in the in-band signal of a certain size (flag_firstep) is at least proportional to any increase in the total power (flag_relstep) with the measured firpwr1 of at least a certain minimum size (flag_firpwr). In this case, it is possible that an incoming in-band signal has come in below an interferer or near the noise floor, thereby not triggering strong signal detection but still could be a weak signal. This weak detection must occur within a limited period of time, i.e. while ycOK>0. To perform the requisite weak signal calculations, old values of firpwr1 and adcpwr could be stored, e.g. as firpwr{2-4} and adcpwr{2-4}. Enough values could be stored so that if the signal is detected during a programmable amplifier ramp, enough difference will exist between the first and last measurements to exceed the given threshold.

Another reason why weak signal detection might not occur is because gc_count is greater than zero. The value gc_count measures the time since the last gain change in short symbol increments. The AGC controller can decrement gc_count for every valid firpwr1(i) measurement from its starting value (e.g. three) after a gain change. In other words, after a gain change, there is a minimum amount of time until a self-correlation is valid.

Yet another reason why weak signal detection might not occur is that the packet has already been found with another method (e.g. strong signal detection), thereby mooting the need to "find" the packet using weak signal detection.

AGC Packet Detection—DC Offset Elimination

The above-described double threshold analysis is successful in reducing false packet detects on interferers during weak signal detection. However, such an analysis may not prevent false detects of DC signals, which always self-correlate. Notably, the output of the ADC typically includes a small DC component. To account for this DC component, the leaky bucket filters (e.g. leaky bucket filters 303) can be implemented with a two-tap DC notch filters. For example, a two-tap infinite impulse response (IIR) filter having a transfer curve of the form $$y[n] = \frac{\alpha - 1}{\alpha} y[n-1] + \frac{1}{\alpha} x[n]$$

can be used, wherein x is the input signal, y is the output signal, and α is a filter parameter (e.g. 32). In general, the leaky bucket filters can use an estimate of the DC level provided by the AGC controller to advantageously cancel out the DC component. In one embodiment, the AGC controller can obtain this estimate from a lookup table based on current gain settings.

AGC Completion Processing

Once a packet is detected using either strong signal detection or weak signal detection, fine gain changes can be made. In one embodiment, fine gain changes are made if consec_gainchanges<min_gainchanges, wherein consec_gainchanges is a value in a counter that begins at zero for strong signal detection and two for weak signal detection. This value represents a coarse measure of time spent in the AGC. Note that approximately two gain change times are needed to perform a windowed self-correlation and thus consec_gainchanges is set to two for weak signal detection. The value consec_gainchanges is incremented every coarse and fine gain change. Additionally, consec_gainchanges is reset when no gain change is made and strong signal detection does not decide that a signal is present. These increment/reset features ensure that a minimum amount of time is spent in the AGC, for either more precise gain or to be sure the gain is set after the PA is done ramping.

Fine gain change can be done according to the following equation:

gain_change(i)=adc_desired size–firpwr1_all(i)

wherein (i) is the chain index.

OTHER EMBODIMENTS

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, an adjacent blocker is defined as an interference signal adjacent to or overlapping the frequency band of interest, whereas an alternate blocker is defined as an interference signal farther away from the frequency band of interest. With a worst case of 6 dB for an adjacent blocker and 32 dB for an alternate blocker, a received blocker at the ADC input can be 12 dB higher than the in-band signal. Therefore, in one embodiment, an analog channel filter and/or anti-aliasing filter may advantageously be placed before the ADCC to perform an adjacent block rejection of 4 dB and an alternate blocker rejection of 20 dB.

Note that in weak signal detection, assuming that the initial SNR is adequate, a limited number of shorts can be used for signal detection. In very weak signal detection, AGC gain adjustments may be more challenging. Therefore, at very low SNRs, a larger number of shorts can be used for signal detection. In this case, weak signal detection can include adding the cross-correlation and self-correlation peaks across antennas as well as in time. A predetermined threshold could be compared to this sum, wherein a sum above the predetermined threshold would indicate packet detection.

Accordingly, it is intended that the scope of the invention be defined by the following Claims and their equivalents.

The invention claimed is:

1. A wireless local area network (WLAN) receiver comprising:
   a first chain including a first antenna and a first plurality of amplifiers for amplifying a signal received by the first antenna and processed by the first chain;
   a second chain including a second antenna and a second plurality of amplifiers for amplifying the signal received by the second antenna and processed by the second chain; and
   a gain control for independently adjusting a gain for each amplifier in the first plurality of amplifiers and the second plurality of amplifiers, wherein the gain control includes:
      a first automatic gain control (AGC) pre-processor coupled to receive a processed signal from the first chain;
      a second AGC pre-processor coupled to receive a processed signal from the second chain; and
      an AGC controller coupled to receive output signals from the first AGC pre-processor and the second AGC pre-processor, the output signals including power measurements and correlation results,
   wherein the AGC controller provides control of each amplifier in the first plurality of amplifiers and the second plurality of amplifiers,
   wherein each AGC pre-processor includes:
      a first filter that eliminates a DC component of the processed signal; and
      a first power detect unit for receiving an output of the first filter and providing a first power value to the AGC controller.

2. The WLAN receiver of claim 1, wherein each AGC pre-processor further includes:
   a set of filters that reduces a data-sampling rate, removes adjacent blockers, and eliminates a DC component of the processed signal;
   a second power detect unit for receiving an output of the set of filters and providing a second power value to the AGC controller; and
   a correlator for receiving an output of the set of filters and providing a correlation value to the AGC controller.

3. The WLAN receiver of claim 2, wherein the correlator can perform strong signal detection and weak signal detection.

4. The WLAN receiver of claim 3, wherein the first and second power values can determine whether a quick drop gain technique or a base gain control technique is performed on each chain.

5. The WLAN receiver of claim 3, wherein the first and second power values can determine whether a received signal is within range on at least one chain.

6. A method of performing automatic gain control for a wireless local area network (WLAN) receiver having multiple chains, each chain including an antenna and a plurality of amplifiers for amplifying a signal received by the antenna and processed by the chain, and an analog to digital converter (ADC), the method comprising:
   determining if an incoming signal is saturating an ADC of any chain;
   if so, then performing a quick drop gain control technique on a set of the plurality of amplifiers for each chain, the quick drop gain control technique including indicating a frequency at which an ADC output exceeds a threshold near saturation;
   if not, then performing a base gain control technique on a set of the plurality of amplifiers for each chain;
   determining whether the quantized signal resulting from the base gain control technique or the quick drop gain control technique is within a preferred range on any chain;
   if so, then maintaining a current gain for the plurality of amplifiers on all chains; and
   if not, then returning to determining if an incoming signal is saturating.

7. The method of claim 6, further including:
   determining whether a packet is detected; and
   if so, then performing fine gain adjustment on a set of the plurality of amplifiers on all chains.

8. The method of claim 7, wherein the base gain control technique includes:
   determining whether a total digitized power at outputs of the ADCs is greater than a predetermined maximum power;
   decreasing a coarse gain adjustment for a set of the plurality of amplifiers in each chain, if the total digitized power at outputs of the ADCs is greater than the predetermined maximum power;
   determining whether a total digitized power at outputs of the ADCs is less than a predetermined minimum power, if the total digitized power at outputs of the ADCs is not greater than the predetermined maximum power;
   increasing a coarse gain adjustment for a set of the plurality of amplifiers in each chain, if the total digitized power at outputs of the ADCs is less than the predetermined minimum power; and
   making no gain adjustment, if the total digitized power at outputs of the ADCs is not greater than the predetermined maximum power and the total digitized power at outputs of the ADCs is not less than a predetermined minimum power.

9. The method of claim 7, wherein the quick drop gain control technique includes:
   setting a high ADC output threshold and a low ADC output threshold, wherein the high ADC output threshold is close to but less than a maximum ADC output value that designates saturation on a high side, and wherein the low ADC output threshold is close to but greater than a minimum ADC output value that designates saturation on a low side;
   counting a number of instances in a sample window that an ADC output exceeds the high ADC output threshold or is less than the low ADC output threshold; and
   if the number of instances exceeds a predetermined threshold, then performing a predetermined gain drop on all chains.

10. The method of claim 7, wherein the quick drop gain control technique includes:
  setting a high ADC output threshold and a low ADC output threshold, wherein the high ADC output threshold is close to but less than a maximum ADC output value that designates saturation on a high side, and wherein the low ADC output threshold is close to but greater than a minimum ADC output value that designates saturation on a low side;
  counting a number of instances in a sample window that an ADC output exceeds the high ADC output threshold or is less than the low ADC output threshold; and
  if the number of instances exceeds a predetermined threshold, then performing a predetermined gain drop on a chain exhibiting frequent saturation events and performing a predetermined, smaller gain drop on other chains.

11. The method of claim 7, wherein determining whether a packet is detected includes at least one of weak signal detection and strong signal detection.

12. The method of claim 11, wherein weak signal detection includes:
  performing self correlation on each chain;
  weighting self correlation values on each chain;
  combining weighted self correlation values from all chains;
  normalizing the combined weighted self correlation values; and
  determining if the normalized result exceeds a self correlation threshold.

13. The method of claim 11, wherein strong signal detection includes:
  determining whether the incoming signal is substantially in-band on any of the chains;
  if so, then performing the fine gain adjustment on all chains; and
  if not, then returning to determining if an incoming signal is saturating.

14. A system for performing automatic gain control for a wireless local area network (WLAN) receiver having multiple chains, each chain including an antenna a plurality of amplifiers for amplifying a signal received by the antenna and processed by the chain, and an analog to digital converter (ADC), the system comprising:
  means for determining if an incoming signal is saturating an ADC of any chain;
  means for performing a quick drop gain control technique on a set of the plurality of amplifiers for each chain if an incoming signal is saturating an ADC of any chain, the quick drop gain control technique including indicating a frequency at which an ADC output exceeds a threshold near saturation;
  means for performing a base gain control technique on a set of the plurality of amplifiers for each chain if an incoming signal is not a proper amplitude for an ADC of any chain;
  means for determining whether the quantized signal resulting from the base gain control technique or the quick drop gain control technique is within a preferred range on either chain;
  mean for maintaining a current gain for the plurality of amplifiers on all chains if the quantized signal is within a preferred range on any chain; and
  means for returning to determining if an incoming signal is saturating if the quantized signal is not within a preferred range on any chain.

15. The system of claim 14, further including:
  mean for determining whether a packet is detected; and
  means for performing fine gain adjustment on a set of the plurality of amplifiers on all chains if a packet is detected.

16. The system of claim 15, wherein the means for performing the base gain control technique includes:
  means for determining whether a total digitized power at outputs of the ADCs is greater than a predetermined maximum power;
  means for decreasing a coarse gain adjustment for a set of the plurality of amplifiers in each chain if the total digitized power at outputs of the ADCs is greater than the predetermined maximum power;
  mean for determining whether a total digitized power at the outputs of the ADCs is less than a predetermined minimum power; and
  means for increasing a coarse gain adjustment for a set of the plurality of amplifiers in each chain if the total digitized power at outputs of the ADCs is less than the predetermined minimum power.

17. The system of claim 15, wherein the means for performing the quick drop gain control technique includes:
  means for setting a high ADC output threshold and a low ADC output threshold, wherein the high ADC output threshold is close to but less than a maximum ADC output value that designates saturation on a high side, and wherein the low ADC output threshold is close to but greater than a minimum ADC output value that designates saturation on a low side;
  means for counting a number of instances in a sample window that an ADC output exceeds the high ADC output threshold or is less than the low ADC output threshold; and
  means for performing a predetermined gain drop on all chains if the number of instances exceeds a predetermined threshold.

18. The system of claim 15, wherein the means for performing the quick drop gain control technique includes:
  means for setting a high ADC output threshold and a low ADC output threshold, wherein the high ADC output threshold is close to but less than a maximum ADC output value that designates saturation on a high side, and wherein the low ADC output threshold is close to but greater than a minimum ADC output value that designates saturation on a low side;
  means for counting a number of instances in a sample window that an ADC output exceeds the high ADC output threshold or is less than the low ADC output threshold; and
  means for performing a predetermined gain drop on a chain exhibiting frequent saturation events and another, smaller predetermined gain drop on other chains.

19. The system of claim 15, wherein the means for performing the quick drop gain control technique includes:
  means for setting a high ADC output threshold and a low ADC output threshold, wherein the high ADC output threshold is close to but less than a maximum ADC output value that designates saturation on a high side, and wherein the low ADC output threshold is close to but greater than a minimum ADC output value that designates saturation on a low side;
  means for counting a number of instances in a sample window that an ADC output exceeds the high ADC output threshold or the low ADC output threshold; and
  means for performing a predetermined gain drop on each chain if the number of instances exceeds a predetermined threshold, wherein the predetermined gain drop for a saturated chain is different than the predetermined gain drop for a non-saturated chain.

20. The system of claim 15, wherein means for determining whether a packet is detected includes at least one of means for performing weak signal detection and means for performing strong signal detection.

21. The system of claim 14, wherein the means for performing weak signal detection includes:
- means for performing self correlation on each chain;
- means for weighting self correlation values on each chain;
- means for combining weighted self correlation values from all chains;
- means for normalizing the combined weighted self correlation values; and
- means for determining if the normalized result exceeds a self correlation threshold.

22. The system of claim 14, wherein the means for performing strong signal detection includes:
- means for determining whether the incoming signal is substantially in-band on any of the chains;
- means for performing the fine gain adjustment on all chains if the incoming signal is substantially in-band on any of the chains; and
- means for returning to determining if an incoming signal is saturating if the incoming signal is not substantially in-band on any of the chains.

* * * * *